United States Patent
Lamesch (10) Patent No.: US 10,698,014 B2
(45) Date of Patent: Jun. 30, 2020

(54) METHOD FOR DETERMINING A SENSE IMPEDANCE IN A GUARD-SENSE CAPACITIVE SENSOR

(71) Applicant: IEE INTERNATIONAL ELECTRONICS & ENGINEERING S.A., Echternach (LU)

(72) Inventor: Laurent Lamesch, Reichlange (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 16/332,625

(22) PCT Filed: Sep. 8, 2017

(86) PCT No.: PCT/EP2017/072607
§ 371 (c)(1),
(2) Date: Mar. 12, 2019

(87) PCT Pub. No.: WO2018/050557
PCT Pub. Date: Mar. 22, 2018

(65) Prior Publication Data
US 2019/0361059 A1   Nov. 28, 2019

(30) Foreign Application Priority Data
Sep. 14, 2016   (LU) .......................... 93211

(51) Int. Cl.
*G01R 27/26*   (2006.01)
*G01D 5/24*   (2006.01)
*B60N 2/00*   (2006.01)

(52) U.S. Cl.
CPC .............. *G01R 27/26* (2013.01); *G01D 5/24* (2013.01); *B60N 2/002* (2013.01)

(58) Field of Classification Search
CPC ........... G01R 27/26; G01D 5/24; B60N 2/002
See application file for complete search history.

(56) References Cited

U.S. PATENT DOCUMENTS

| 4,935,692 A  * | 6/1990 | Wakasugi | G01R 27/02 324/123 C |
| 8,354,936 B2 * | 1/2013 | Ootaka | B60N 2/002 180/272 |

(Continued)

FOREIGN PATENT DOCUMENTS

| EP | 0327254 A1 * | 8/1989 | ............. G01R 27/02 |
| WO | WO2016062824 A1 | 4/2016 | |

(Continued)

OTHER PUBLICATIONS

"Electric Field Sensing for Graphical Interfaces" by J.R. Smith, published in Computer Graphics I/O Devices, Issue May/Jun. 1998, pp. 58-60.

(Continued)

Primary Examiner — Maniel A Rivera Vargas
Assistant Examiner — Yaritza H Perez Bermudez
(74) Attorney, Agent, or Firm — Reising Ethington P.C.

(57) ABSTRACT

A method for determining a sense impedance of a guard-sense capacitive sensor operated in loading mode, the sensor having an electrically conductive sense electrode and an electrically conductive guard electrode. The method includes: providing a periodic guard voltage to the guard electrode; sequentially providing periodic reference voltages $Vref_i$ via a reference impedance Zref, to the sense node; for each reference voltage, determining the value $Im_i$ of the current applied to the sense node; determining the sense reference voltage Vs to be provided to the sense node, which would lead to a current with an amplitude of zero; and calculating the unknown sense impedance Zx of the sense (Continued)

electrode, with reference to the sense reference voltage Vs, the periodic guard voltage Vg, and the reference impedance Zref.

11 Claims, 3 Drawing Sheets

(56) References Cited

U.S. PATENT DOCUMENTS

| | | | |
|---|---|---|---|
| 2001/0045733 A1* | 11/2001 | Stanley | B60N 2/002 280/735 |
| 2006/0284639 A1* | 12/2006 | Reynolds | G01D 5/24 324/688 |
| 2012/0161777 A1 | 6/2012 | Nakagawa | |
| 2013/0270874 A1* | 10/2013 | Lamesch | B60N 2/002 297/180.12 |
| 2015/0367751 A1 | 12/2015 | Lamesch et al. | |
| 2017/0336469 A1 | 11/2017 | Lamesch | |
| 2017/0355337 A1 | 12/2017 | Lamesch | |
| 2018/0358941 A1* | 12/2018 | Lamesch | G01D 5/24 |

FOREIGN PATENT DOCUMENTS

| | | | |
|---|---|---|---|
| WO | WO2016071416 A1 | 5/2016 | |
| WO | WO-2017102572 A1 * | 6/2017 | G01D 5/24 |

OTHER PUBLICATIONS

International Search Report corresponding to International application No. PCT/EP2017/072607, dated Dec. 4, 2017, 3 pages.
Written Opinion corresponding to application No. PCT/EP2017/072607, dated Dec. 4, 2017, 5 pages.

* cited by examiner

METHOD FOR DETERMINING A SENSE IMPEDANCE IN A GUARD-SENSE CAPACITIVE SENSOR

TECHNICAL FIELD

The present invention generally relates to the field of capacitive sensing circuits for determining a sense impedance of a guard-sense capacitive sensor. The invention more particularly relates to a method for determining a sense impedance of a guard-sense capacitive sensor operated in loading mode.

BACKGROUND OF THE INVENTION

Capacitive sensing is now commonly used in high technology domains. In automotive vehicles for example, capacitive sensing circuits are often installed in occupant detection systems in order to control the triggering of security appliances such as airbags or seat belt pretensioners. It is now common to use capacitive sensing circuits called guard-sense capacitive circuits operated in loading mode.

The term "loading mode" is used to describe a concept of electric field sensing used for making non-contact three dimensional position measurements, and more particularly for detecting a presence and/or a position of a human body in relation with an electrode. The detection is deduced from the measurement of the current pulled from an electrode or transmitter plate through the human body, to the ground. This concept is to be distinguished from the "shunt mode", and the "transmit mode", which are the two other common capacitive sensing modes. For further explanations about the different capacitive sensing operating mode, refer to the technical paper entitled "Electric Field Sensing for Graphical Interfaces" by J. R. Smith, published in Computer Graphics I/O Devices, Issue May/June 1998, pages 58-60.

A guard-sense capacitive sensor as it is commonly known in the art comprises a sense electrode connected to a sense node, and a guard electrode connected to a guard node. The sensor further comprises a periodic voltage source connected to the guard node for providing, in operation, a guard voltage of a predetermined amplitude to the guard node.

The sensor further comprises a control and evaluation circuit connected to the sense node and the guard node. The control and evaluation circuit is configured to, in operation, keep the sense electrode at the same potential as the guard electrode by injecting a current to the sense node which corresponds to the current which is drawn from the sense electrode via the unknown sense impedance to be determined. The space between the two electrodes is thus free of an electric field, and the sense electrode becomes insensitive to a body located anywhere in the direction of the guard electrode.

It is understood that in the context of the present application we use a common theoretical approximation to assert that the sense and the guard electrode are kept at the same potential and that the space between said two electrodes is free of an electric field. This approximation will also be used in the following description.

The control and evaluation circuit is configured to determine the current it is injecting to the sense node and to issue an output signal which is indicative of the current injected into the sense node and thus of the sense impedance to be determined. In order to perform these tasks, the control and evaluation circuit commonly comprises a transimpedance amplifier and an analog to digital converter. The negative and positive inputs of the transimpedance amplifier are respectively connected to the sense node and the guard node. The output signal of the transimpedance amplifier is proportional to the current injected by the amplifier into its negative input in order to keep the difference of potentials between its inputs equal to zero. The analog to digital converter is usually connected to the output of the amplifier.

The guard-sense capacitive sensing circuit has the advantage of being directional and capable of detecting a body without being perturbed by non-dielectric surrounding objects. Nevertheless, the measuring circuit commonly uses non-ideal components inducing a non-negligible error in the determination of the sense impedance that can be critical at low impedances.

Generally, the error in the determination of the sense impedance is associated with various unknown impedances, of which the main source is the sense-to-guard impedance. It is understood that the guard-sense impedance is the impedance between the guard node and the sense node. The guard-sense impedance is also called hereafter parasitic impedance.

There are already solutions known in the art to measure time variant non-ideal device impedance by suppressing the influence of the parasitic impedance in capacitive measurement circuits. For example patent document U.S. Pat. No. 4,481,464, describes a solution to improve the impedance measurement in a non-ideal capacitive measurement circuit. The circuit comprises an input portion including a pulse generator, a sine wave generator and performs a demodulation in order to separate the interference component of the measured signal corresponding to the parasitic impedance.

Such a solution however only applies to capacitive sensing systems operating in coupling mode and is not applicable to loading mode measurement to which the present invention relates.

SUMMARY

An object of the invention is therefore to propose a method for determining a sense impedance of a guard-sense capacitive sensor operated in loading mode that improves the measurements of the sensor in comparison with the prior art.

In at least some embodiments, the invention overcomes the above discussed deficiencies and disadvantages by providing a method for determining a sense impedance of a guard-sense capacitive sensor operated in loading mode. The sensor comprises an electrically conductive sense electrode connected to a sense node, an electrically conductive guard electrode connected to a guard node, a periodic guard voltage source for providing a periodic guard voltage of an amplitude Vg to the guard node, and a control and evaluation circuit operatively connected to the sense node and the guard node.

In the context of the present invention and unless clearly expressed otherwise the term "amplitude" of a current or a voltage will refer to the complex amplitude of said current or voltage.

The control and evaluation circuit is configured to maintain, in operation, the potential difference between the sense node and the guard node to zero by applying a current to the sense node, and to determine a value corresponding to an amplitude of said current applied to the sense node.

The method comprises the steps of:
a. providing a periodic guard voltage using the periodic guard voltage source
b. sequentially providing a number n of different periodic reference voltages of amplitudes $Vref_i$ via a reference impedance of a predetermined value Zref, to the sense node using a reference periodic voltage source, wherein i and n are positive natural numbers, and $1 \leq i \leq n$ with $n \geq 2$;

c. for each provided reference voltage of amplitude $Vref_i$, determining the value corresponding to the respective amplitude $Im_i$ of the current applied to the sense node by the current measurement circuit;

d. determining the amplitude of a sense reference voltage Vs to be provided to the sense node using the reference periodic voltage source, which would lead to a current, applied by the control and evaluation circuit, with an amplitude of zero;

e. calculating the unknown sense impedance Zx of the sense electrode, with reference to the sense reference voltage Vs determined in step d, the periodic guard voltage Vg, and the reference impedance Zref.

The method provides a way of determining the unknown impedance of the sense electrode with no influence of the guard-sense impedance. Indeed, the calculation of the unknown sense impedance is made by virtually considering a current applied to the sense node by the control and evaluation circuit with an amplitude of zero. This means that due to the theoretical approximation, the present invention aims at determining the unknown impedance in the virtual case that there is no current flowing through the parasitic guard-sense impedance between the guard node and the sense node and consequently the guard-sense impedance between the guard and the sense node is eliminated from the determination.

According to a preferred embodiment of the invention, step e comprises the step of calculating the unknown sense impedance Zx of the sense electrode, with reference to the sense reference voltage determined in step d, using the formula:

$$Zx = \frac{Zref \times Vg}{Vs - Vg}$$

This formula uses the simplification in the circuit that at the virtual operation point with Vs applied, the current applied to the sense node by the control and evaluation circuit has an amplitude substantially equal to zero. The formula only combines predetermined values.

In embodiments, step d comprises the step of calculating by interpolation the amplitude of the sense reference voltage Vs using the formula:

$$Vs = Vref_1 - Im_1 \times \frac{Vref_2 - Vref_1}{Im_2 - Im_1}$$

wherein Vref1 and Vref2 are two different reference voltages provided by the reference periodic voltage source, Im1 and Im2 are respectively amplitudes of the currents applied by the sense measurement circuit to the sense node for the provided voltages Vref1 and Vref2.

Accordingly, the sense reference voltage Vs can be determined with a minimum of two measurements, which is only one more than in a typical prior art sense impedance measurement with a greater margin of error. The speed of the measurement result is an important characteristic as the impedance measured is time-variant.

In embodiments, step d comprises the step of adjusting the value of the reference voltage $Vref_i$ with a control loop until reaching the sense reference voltage Vs for which the amplitude of the current applied by the sense measurement circuit to the sense node is substantially zero.

In order to reduce a margin of error, present for each measurement used to determine the sense reference voltage, this embodiment of the invention uses a control loop that adjusts the sense reference voltage Vs until reaching a predetermined margin of error. A control loop slows down the reactivity of the sensor, but improves the sensibility of a resulting sense impedance measurement. The control loop is configured to balance the reactivity with the sensibility of the sense impedance measurement in order to provide for an optimized measurement.

Preferably, step d of the invention comprises the steps of: calculating by interpolation the amplitude of the sense reference voltage Vsc using the formula:

$$Vsc = Vref_1 - Im_1 \times \frac{Vref_2 - Vref_1}{Im_2 - Im_1}$$

wherein Vref1 and Vref2 are two different reference voltages provided by the reference periodic voltage source, Im1 and Im2 are respectively the current applied by the sense measurement circuit to the sense node for the provided voltages Vref1 and Vref2; and starting from the amplitude of the calculated sense reference voltage Vsc, adjusting the value of the reference voltage with a control loop until reaching an improved sense reference voltage Vs, for which the measure of the amplitude of the current applied by the sense measurement circuit to the sense node, is substantially zero.

In this embodiment of the invention, the determination of the sense reference voltage is done in two steps. The first step is an interpolation made after the two first measurements. The interpolation results to a value that is close to an ideal value but still has a margin of error. The second step consists of reducing said margin of error by fine tuning the result with a control loop. In that manner, the speed of the determination of the sense reference voltage is greatly improved in comparison with an embodiment only using a control loop, and the accuracy of the result is improved in comparison with an embodiment of the method only using an interpolation.

In another aspect of the invention, an impedance measurement circuit for determining a sense impedance of a guard-sense capacitive sensor operated in loading mode is provided. Said sensor comprises an electrically conductive sense electrode connected to a sense node, an electrically conductive guard electrode connected to a guard node.

The impedance measurement circuit comprises a periodic guard voltage source for providing a periodic guard voltage of an amplitude Vg to the guard node, and a control and evaluation circuit operatively connected to the sense node and the guard node. The control and evaluation circuit is configured to maintain in operation the potential difference between the sense node and the guard node to zero by applying a current to the sense node, and to determine a value corresponding to an amplitude of said current applied to the sense node.

The impedance measurement circuit further comprises a reference periodic voltage source, configured to provide a number n of different periodic reference voltages of amplitudes Vrefi to said sense node, via a reference impedance of a predetermined value Zref, wherein i and n are positive natural numbers, and $1 \leq i \leq n$ with $n \geq 2$.

The control and evaluation circuit is configured to determine in operation the value corresponding to the respective amplitude Imi of the current applied to the sense node for each provided reference voltage of amplitude Vrefi; and the amplitude of a sense reference voltage Vs to be provided to the sense node by the reference periodic voltage source, which would lead to a current, applied by the control and evaluation circuit, with an amplitude of zero. The control and evaluation circuit is also configured to calculate in operation the unknown impedance of the sense electrode, with reference to the sense reference voltage Vs, the periodic guard voltage Vg, and the reference impedance Zref, i.e. at a virtual operation point considering Vs applied by the reference periodic voltage source.

The terms "configured to", as used in this application, shall in particular be understood as being specifically programmed, laid out, furnished, or arranged.

The circuit according to the invention differs from a typical prior art sense impedance measurement circuit by the addition of a periodic reference voltage source and a reference impedance connected to the sense node. In operation, the signal provided by the reference voltage source allows the determination of the signal needed to compensate the current lost by the circuit between the sense impedance and the ground.

By providing a signal to the sense node that compensates the current lost by the impedance measurement circuit through the sense impedance to ground, the circuit may be approximately considered to operate at a operation point where the potential of the sense node remains the same as the potential of the guard node and the current provided to the sense node by the control and evaluation circuit has an amplitude equal to zero resulting to the suppression of the guard-sense impedance. At this operation point, the aforementioned provided signal to the sense node is proportional to the sense impedance.

Accordingly the determination of the signal required to compensate the current flowing from the sense electrode to ground through the sense impedance allows the control an evaluation circuit to determine the sense impedance while suppressing the parasitic guard-sense impedance.

It should be noted that the realization of the circuit relies on commonly used basic electrical components with no particular high priced component. Hence the global cost of the circuit is kept low.

In a preferred embodiment of the invention, the control and evaluation circuit is configured to calculate in operation the unknown impedance between the sense electrode and ground, with reference to the sense reference voltage Vs, the periodic guard voltage Vg, and the reference impedance Zref, using the formula:

$$Zx = \frac{Zref \times Vg}{Vs - Vg}$$

In embodiments, the control and evaluation circuit is configured to determine in operation the amplitude of the sense reference voltage Vs using a calculation by interpolation through the formula:

$$Vs = Vref_1 - Im_1 \times \frac{Vref_2 - Vref_1}{Im_2 - Im_1}$$

Vref1 and Vref2 are two different reference voltages provided by the reference periodic voltage source, Im1 and Im2 are respectively amplitudes of the currents applied by the sense measurement circuit to the sense node for the provided voltages Vref1 and Vref2.

In embodiments, the control and evaluation circuit is configured to determine in operation the amplitude of the sense reference voltage Vs by adjusting the value of the reference voltage Vrefi with a control loop until reaching the sense reference voltage Vs at which the amplitude of the current applied by the sense measurement circuit to the sense node, is substantially zero.

In a preferred embodiment of the invention, the control and evaluation circuit is configured to determine in operation the amplitude of the sense reference voltage Vs by using a calculation by interpolation to determine the amplitude of the sense reference voltage Vsc though the formula:

$$Vs_c = Vref_1 - Im_1 \times \frac{Vref_2 - Vref_1}{Im_2 - Im_1}$$

wherein Vref1 and Vref2 are two different reference voltages provided by the reference periodic voltage source, Im1 and Im2 are respectively the current applied by the sense measurement circuit to the sense node for the provided voltages Vref1 and Vref2; then starting from the amplitude of the calculated sense reference voltage Vsc, the control and evaluation circuit is configured to adjust in operation the value of the reference voltage with a control loop until reaching an improved sense reference voltage Vs, for which the measure of the amplitude of the current applied by the sense measurement circuit to the sense node, is substantially zero.

The merit of the impedance measurement circuit according to the invention is that it is configured to perform in operation all the steps of the method according to the invention. Consequently, the advantages of the method apply to the circuit. Moreover, the circuit does not comprise any particularly costly components.

Advantageously, the control and evaluation circuit further comprises a processor unit and a digital memory unit, said digital memory unit comprising program code stored therein, which when executed on the processor causes the processor to execute a method for determining a sense impedance of a guard-sense capacitive sensor operated in loading mode according to the invention.

The computer program code allows the impedance measurement circuit to perform the steps of the method, in an automatized process and in real time.

The circuit and/or the method may be implemented in a vehicle to perform occupancy detection. The resulting sensor may be for example a seat occupancy sensor, an arm position sensor, a child seat detection sensor or the like.

BRIEF DESCRIPTION OF THE DRAWINGS

Further details and advantages of the present invention will be apparent from the following detailed description of not limiting embodiments with reference to the attached drawing, wherein.

DESCRIPTION OF THE ILLUSTRATED EMBODIMENTS

In the context of the invention, the term "guard-sense capacitive sensor" will be used to designate an "impedance measurement circuit for determining a sense impedance of a guard-sense capacitive sensor operated in loading mode".

Figure 1:
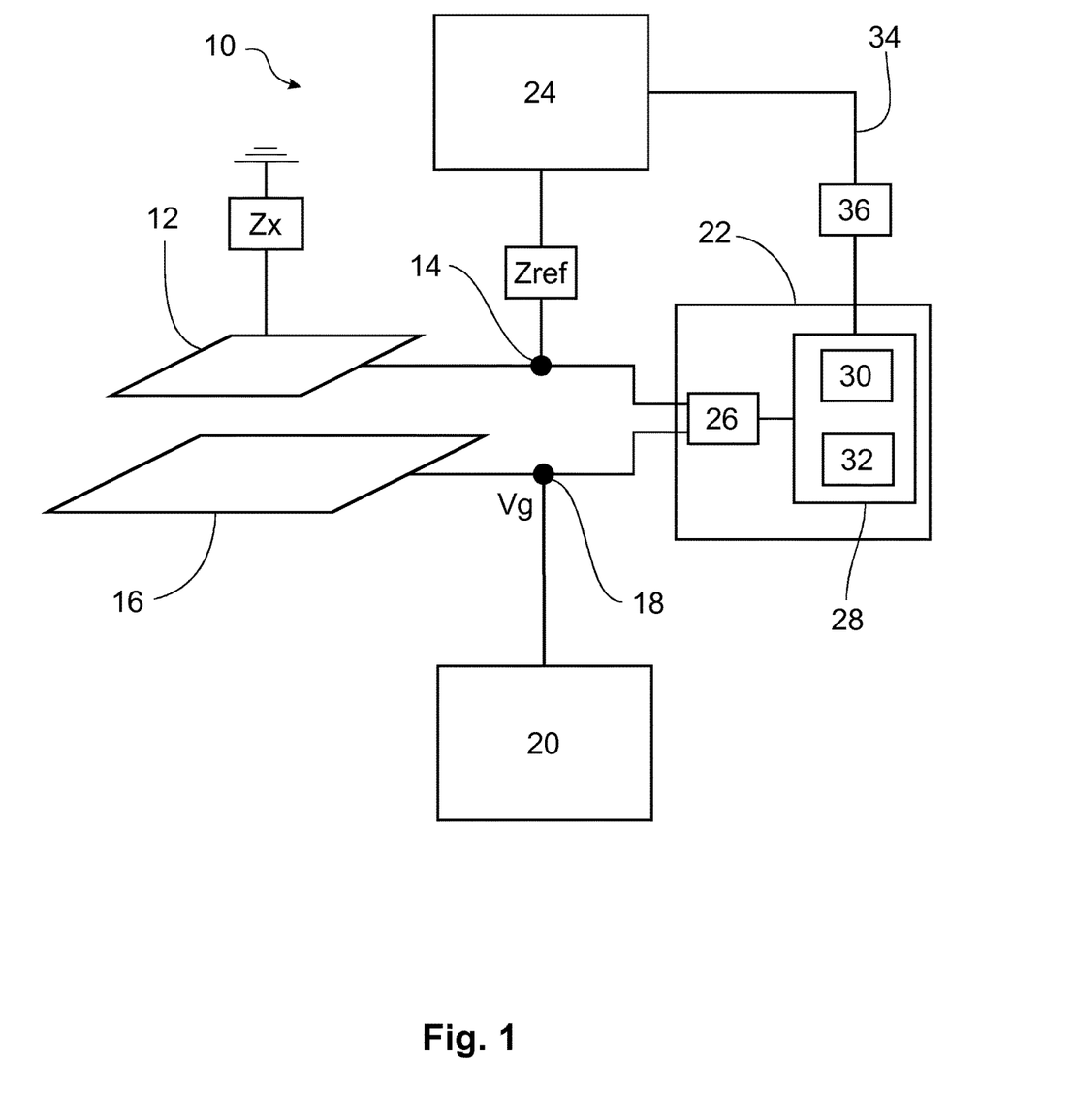
FIG. 1 shows a layout of an embodiment of an impedance measurement circuit according to an embodiment of the invention.

As illustrated in FIG. 1, a guard-sense capacitive sensor 10 comprises an electrically conductive sense electrode 12 connected to a sense node 14 and an electrically conductive guard electrode 16 connected to a guard node 18. The two electrodes 12, 16 are galvanically isolated so that no direct current flows between them.

The sensor 10 comprises a periodic guard voltage source 20 connected to the guard node 18, and a control and an evaluation circuit 22 operatively connected to the sense node 14 and the guard node 18.

The sensor 10 further comprises a periodic reference voltage source 24 connected to the sense node 14 through a reference impedance of a predetermined value Zref.

The periodic guard voltage has a predetermined amplitude Vg and a given frequency. The frequency of the guard voltage is preferably determined in order to minimize the influence of the surrounding parasitic impedances on the sense impedance. This determination is based on a list of known values.

The control and evaluation circuit 22 is configured to maintain in operation the potential difference between the sense node 14 and the guard node 18 to zero by applying in real time a current to the sense node 14, which current compensates for the current flowing from the sense electrode 12 through the unknown sense impedance Zx to ground. In the following, the current applied by the control and evaluation circuit 22 may also be referred to as injected current.

The control and evaluation circuit 22 is further configured to determine in operation and in real time, a value corresponding to an amplitude of the injected current. In the following the latter value may also be referred to as measured current Im.

In embodiments, the control and evaluation circuit comprises a current-to-voltage converter, like for instance a transimpedance amplifier 26, with its negative input connected to the sense node 14 and its positive input connected to the guard node 18. The output voltage of the transimpedance amplifier 26 is proportional to the current applied to the sense node 14 in order to maintain the same potential to the sense 14 and guard node 18.

Preferably, the control and evaluation circuit 22 comprises a measurement circuit 28 configured to determine the variation of the output voltage of the transimpedance amplifier 26 and to translate the information into the value of the input current Im applied by the transimpedance amplifier 26.

When a body comes close to the sense electrode 12, current flows from said sense electrode 12 through said body to the ground. The current flowing from the sense node 14 to the ground rises. The control and evaluation circuit 22 reacts by raising the injected current Im, and measures said injected current Im.

The presence of a body close to the sense electrode 12 can be modeled in the sensor's circuit 10 by an additional unknown sense impedance Zx between the sense electrode 12 and the ground. In addition, the value of Zx can be related to the nature of said body. The sensor is then capable of distinguishing between an adult, a child, and another body. For a given body, the value of the unknown impedance Zx is proportional to the distance of the body from the sense electrode 12.

Figure 2:
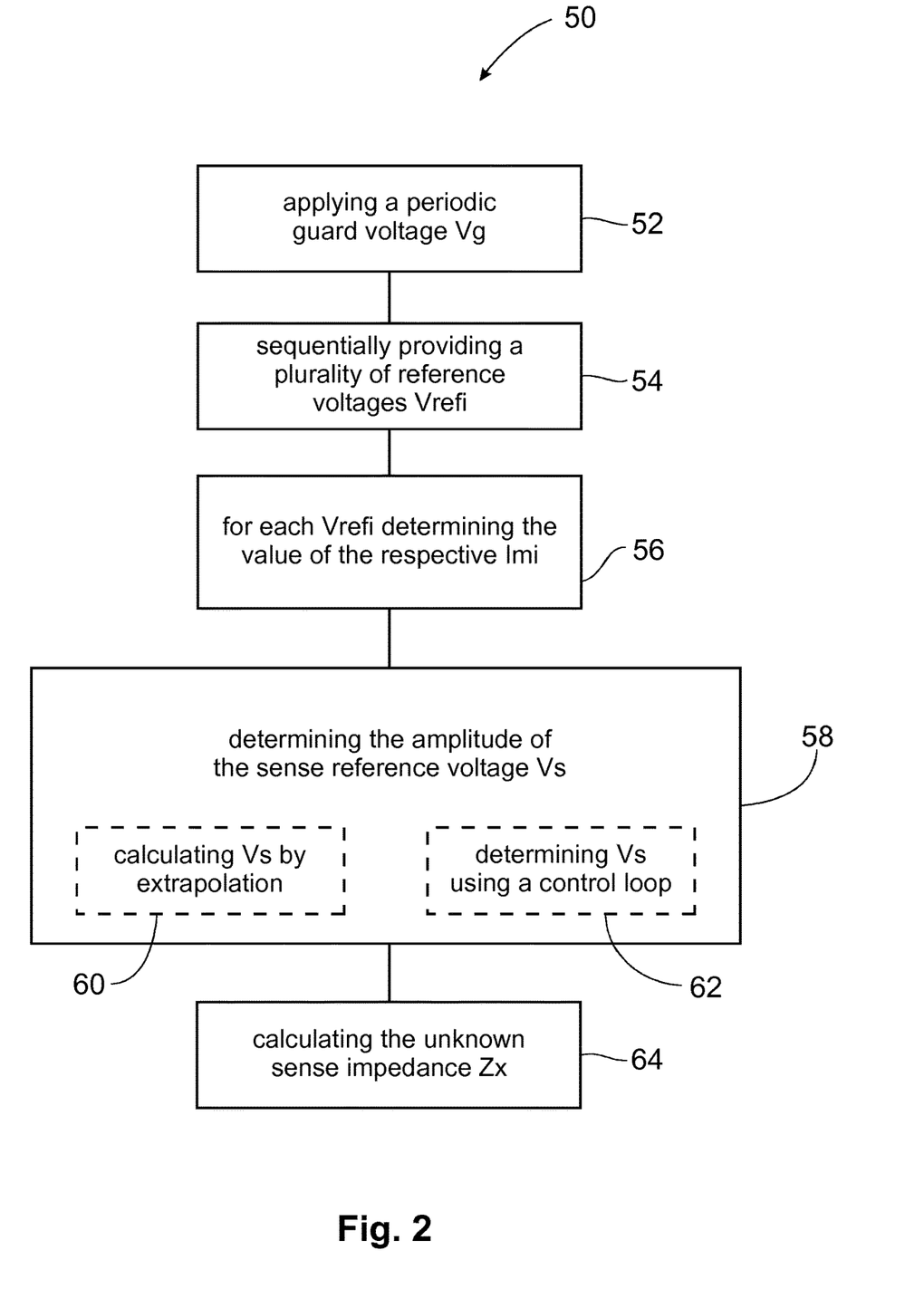
FIG. 2 is a flowchart of an embodiment of a method according to and embodiment of the invention.

As illustrated in FIG. 2, in a first step 52 of the method 50 the guard voltage source 20 applies a periodic guard voltage Vg to the guard node 18. The periodic guard voltage is preferably a sine wave signal of amplitude Vg.

In a next step 54, the reference voltage source 24 sequentially provides a number n of different periodic reference voltages of amplitudes $Vref_i$ via the reference impedance Zref, to the sense node 14, wherein the numbers i and n are positive natural numbers, and $1 \leq i \leq n$ with $n \geq 2$.

Advantageously, the reference voltage source 24 provides a first predetermined reference voltage of amplitude $Vref_1$, and the value of $Vref_1$ may be a predetermined value corresponding to a voltage needed when no dielectric body is proximate to the sense electrode 12.

In some embodiments, the measuring circuit 28 further comprises components in order to store data and execute automatic steps, like for example a processor unit 30 and a digital memory unit 32. The digital memory unit 32 is configured to store the predetermine values used in the method 50.

Preferably, the different reference voltages all have the same frequency, and said frequency is the same as the frequency of the guard voltage.

In another step 56 of the method 50, the measuring system 28 determines for each provided reference voltage of amplitude $Vref_i$, the value corresponding to the respective amplitude $Im_i$ of the current applied to the sense node 14 by the control and evaluation circuit 22.

Then in a step 58, the control and evaluation circuit 22 determines the value of the sense reference voltage with an amplitude Vs that would lead to a sense injected current of an amplitude Ims equal to zero.

The measured injected current Im is deemed substantially equal to zero if it is within a predetermined threshold domain of values, such that $Im- \leq Im \leq Im+$, wherein Im+ is a positive threshold and Im− is a negative threshold. The threshold values Im+, and Im− are predetermined in accordance with a targeted sensibility and reactivity of the sensor. Indeed, for a wide threshold domain, the determination of the reference voltage Vs will be fast but inaccurate, and inversely, for a narrow threshold domain the determination of Vs will be time-costly and accurate. The threshold domain is preferably established during the conception of the sensor.

In a preferred embodiment, step 58 of the method 50 comprises the following two steps:

In a first step 60, based on a set of two different $Vref_i$, and their corresponding determined $Im_i$, the control and evaluation circuit 22 calculates by extrapolation the value of the calculated sense reference voltage amplitude Vsc that would lead to the sense injected current of amplitude Ims=0.

The calculation by extrapolation is based on the insight that for a given frequency of the reference voltage $Vref_i$, the variation of the amplitude of the injected current is linearly proportional to the variation of the amplitude of the voltage provided by the reference voltage source 24. This means that for any two different periodic reference voltages of respective amplitudes $Vref_a$, $Vref_b$, provided to the sense node by the periodic reference voltage source 24, the control and evaluation circuit 22 measures two injected current $Im_a$, $Im_b$, respectively for $Vref_a$, $Vref_b$, and obtains the following relation:

$$\frac{Vref_a - Vref_b}{Im_a - Im_b} = K$$

wherein K is a constant.

Consequently, the following equation can be deduced:

$$\frac{Vref_1 - Vsc}{Im_1 - Ims} = \frac{Vref_2 - Vref_1}{Im_2 - Im_1}$$

wherein $Vref_1$ and $Vref_2$ are two different reference voltages provided by the reference periodic voltage source, $Im_1$ and $Im_2$ are respectively amplitudes of the currents applied by the sense measurement circuit to the sense node for the provided voltages $Vref_1$ and $Vref_2$. For Ims=0, the latter equation can be reduced as:

$$Vsc = Vref_1 - Im_1 \times \frac{Vref_2 - Vref_1}{Im_2 - Im_1}$$

Advantageously, $Vref_1$ and $Vref_2$, are the two first reference voltages sequentially provided by the reference voltage source 24.

In a second step 62, the control and evaluation circuit 22 uses a control loop 34 in order to fine tune the result. In some embodiments, the control loop 34 comprises a PID controller 36. Starting from the value of Vsc, the PID controller 36 adjusts in operation the value of the amplitude of the reference periodic voltage Vref, until reaching a sense injected current amplitude Ims.

Starting from the value of Vsc, the control and evaluation circuit 22 adjusts the value of the amplitude of the reference periodic voltage after each new measurement done at step 62, until reaching a sense injected current amplitude Ims deemed substantially equal to zero. Once the sense injected current amplitude Ims value reached, the control and evaluation circuit deduces the real amplitude of the sense reference voltage Vs.

It should be noted that in some embodiments of the invention, the step 58 of determining the amplitude of the sense reference voltage Vs is realized using only the calculation by extrapolation as described above. The control and evaluation circuit 22 assimilates the calculated sense reference voltage Vsc to the real sense reference voltage Vs using the approximation:

Vsc=Vs

In yet other embodiments of the invention, the step 58 of determining the amplitude of the sense reference voltage Vs is realized only by a control and evaluation circuit comprising a control loop as described above, with the exception that the control loop starts from a preset value of the reference voltage amplitude, which may be the same for all the measurements.

Figure 3:
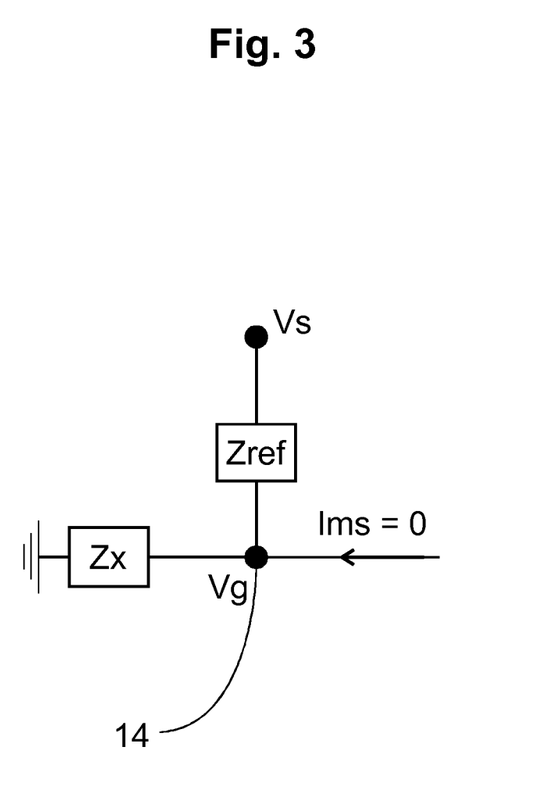
FIG. 3 is an explicative layout around the sense node of FIG. 1 used to perform the calculation of the unknown sense impedance according to FIG. 2.

In preferred embodiments of the method, once the sense reference voltage Vs is determined, the method 50 comprises a step 64 of calculating via the control and evaluation circuit 22 the unknown sense impedance Zx between the sense electrode 14 and the ground. The calculation of the unknown sense impedance Zx is deduced from Kirchhoff's circuit laws applied to the sense node 14, in a situation where the current injected by the control and evaluation circuit 22 to the sense node 14 is substantially equal to zero and the potential of the sense node 14 is equal to the guard potential Vg, as illustrated in FIG. 3. The formula used may be for example the following:

$$Zx = \frac{Zref \times Vg}{Vs - Vg}$$

In preferred embodiments of the circuit, the digital memory unit 32 comprises computer program code stored therein.

When executed on the processor, the program code causes the processor 30 to execute a method for determining a sense impedance of a guard-sense capacitive sensor operated in loading mode as described above.

The invention claimed is:

1. A method for determining a sense impedance of a guard-sense capacitive sensor operated in loading mode, the sensor comprising an electrically conductive sense electrode connected to a sense node, an electrically conductive guard electrode connected to a guard node, a periodic guard voltage source for providing a periodic guard voltage of an amplitude Vg to the guard node, and a control and evaluation circuit operatively connected to the sense node and the guard node, the control and evaluation circuit being configured to maintain the potential difference between the sense node and the guard node to zero by applying a current to the sense node, and to determine a value corresponding to an amplitude of said current applied to the sense node, the method comprising the steps of:
   a. applying a periodic guard voltage to the guard node using the periodic guard voltage source;
   b. sequentially applying a number n of different periodic reference voltages of amplitudes $Vref_i$ via a reference impedance of a predetermined value Zref, to the sense node using a reference periodic voltage source, wherein i and n are positive natural numbers, and $1 \leq i \leq n$ with $n \geq 2$;
   c. for each provided reference voltage of amplitude $Vref_i$, determining the value corresponding to the respective amplitude $Im_i$ of the current applied to the sense node by the control and evaluation circuit;
   d. determining the amplitude of a sense reference voltage Vs to be provided to the sense node using the reference periodic voltage source, which would lead to a current, applied by the control and evaluation circuit, with an amplitude of zero; and
   e. calculating the unknown sense impedance Zx of the sense electrode, with reference to the sense reference voltage Vs determined in step d, the periodic guard voltage Vg, and the reference impedance Zref, wherein a value of the calculated unknown sense impedance indicates a nature of a body positioned adjacent the sense electrode.

2. A method for determining a sense impedance of a guard-sense capacitive sensor operated in loading mode as claimed in claim 1, wherein step e comprises the step of calculating the unknown sense impedance Zx of the sense electrode, with reference to the sense reference voltage determined in step d, using the formula:

$$Zx = \frac{Zref \times Vg}{Vs - Vg}.$$

3. A method for determining a sense impedance of a guard-sense capacitive sensor operated in loading mode as claimed in claim 1, wherein step d comprises the step of calculating by interpolation the amplitude of the sense reference voltage Vs using the formula:

$$Vs = Vref_1 - Im_1 \times \frac{Vref_2 - Vref_1}{Im_2 - Im_1}$$

wherein $Vref_1$ and $Vref_2$ are two different reference voltages provided by the reference periodic voltage source, $Im_1$ and $Im_2$ are respectively amplitudes of the currents applied by the sense measurement circuit to the sense node for the provided voltages $Vref_1$ and $Vref_2$.

4. A method for determining a sense impedance of a guard-sense capacitive sensor operated in loading mode as claimed in claim 1, wherein step d comprises the step of adjusting the value of the reference voltage $Vref_i$ with a control loop until reaching the sense reference voltage Vs for which the amplitude of the current applied by the sense measurement circuit to the sense node, is substantially zero.

5. A method for determining a sense impedance of a guard-sense capacitive sensor operated in loading mode as claimed in claim 1, wherein step d comprises the steps of:
calculating by interpolation the amplitude of the sense reference voltage $Vs_c$ using the formula:

$$Vs_c = Vref_1 - Im_1 \times \frac{Vref_2 - Vref_1}{Im_2 - Im_1}$$

wherein Vref1 and Vref2 are two different reference voltages provided by the reference periodic voltage source, Im1 and Im2 are respectively the current applied by the sense measurement circuit to the sense node for the provided voltages Vref1 and Vref2;
and starting from the amplitude of the calculated sense reference voltage Vsc, adjusting the value of the reference voltage with a control loop until reaching an improved sense reference voltage Vs, for which the measure of the amplitude of the current applied by the sense measurement circuit to the sense node, is substantially zero.

6. An impedance measurement circuit for determining a sense impedance of a guard-sense capacitive sensor operated in loading mode, said sensor comprising an electrically conductive sense electrode connected to a sense node, an electrically conductive guard electrode connected to a guard node, and said impedance measurement circuit comprising:
a periodic guard voltage source for applying a periodic guard voltage of an amplitude Vg to the guard node, and
a control and evaluation circuit operatively connected to the sense node and the guard node, the control and evaluation circuit being configured to maintain in operation the potential difference between the sense node and the guard node to zero by applying a current to the sense node, and to determine a value corresponding to an amplitude of said current applied to the sense node, and
a reference periodic voltage source, said reference periodic voltage source being configured to apply number n of different periodic reference voltages of amplitudes $Vref_i$ to said sense node, via a reference impedance of a predetermined value Zref, wherein i and n are positive natural numbers, and $1 \le i \le n$ with $n \ge 2$;
wherein said control and evaluation circuit is configured to determine in operation:
the value corresponding to the respective amplitude $Im_i$ of the current applied to the sense node for each provided reference voltage of amplitude $Vref_i$; and
the amplitude of a sense reference voltage Vs to be provided to the sense node using the reference periodic voltage source, which would lead to a current, applied by the control and evaluation circuit, with an amplitude of zero;
and wherein, the control and evaluation circuit is configured to calculate in operation the unknown impedance of the sense electrode, with reference to the sense reference voltage Vs, the periodic guard voltage Vg, and the reference impedance Zref, wherein a value of the calculated unknown impedance of the sense electrode indicates a nature of a body positioned adjacent the sense electrode.

7. An impedance measurement circuit as claimed in claim 6, wherein the control and evaluation circuit is configured to calculate in operation the unknown impedance of the sense electrode, with reference to the sense reference voltage Vs, the periodic guard voltage Vg, and the reference impedance Zref, using the formula:

$$Zx = \frac{Zref \times Vg}{Vs - Vg}.$$

8. An impedance measurement circuit as claimed in claim 6, wherein the control and evaluation circuit is configured to determine in operation the amplitude of the sense reference voltage Vs using a calculation by interpolation through the formula:

$$Vs = Vref_1 - Im_1 \times \frac{Vref_2 - Vref_1}{Im_2 - Im_1}$$

wherein $Vref_1$ and $Vref_2$ are two different reference voltages provided by the reference periodic voltage source, $Im_1$ and $Im_2$ are respectively amplitudes of the currents applied by the sense measurement circuit to the sense node for the provided voltages $Vref_1$ and $Vref_2$.

9. An impedance measurement circuit as claimed in claim 6, wherein the control and evaluation circuit is configured to determine in operation the amplitude of the sense reference voltage Vs by adjusting the value of the reference voltage $Vref_i$ with a control loop until reaching the sense reference voltage Vs for which the amplitude of the current applied by the sense measurement circuit to the sense node, is substantially zero.

10. An impedance measurement circuit as claimed in claim 6, wherein the control and evaluation circuit is configured to determine in operation the amplitude of the sense reference voltage Vs by using a calculation by interpolation to determine the amplitude of the sense reference voltage $Vs_c$ though the formula:

$$Vs_c = Vref_1 - Im_1 \times \frac{Vref_2 - Vref_1}{Im_2 - Im_1}$$

wherein $Vref_1$ and $Vref_2$ are two different reference voltages provided by the reference periodic voltage source, $Im_1$ and $Im_2$ are respectively the current applied by the sense measurement circuit to the sense node for the provided voltages $Vref_1$ and $Vref_2$;

then starting from the amplitude of the calculated sense reference voltage Vsc, the control and evaluation circuit is configured to adjust in operation the value of the reference voltage with a control loop until reaching an improved sense reference voltage Vs, for which the measure of the amplitude of the current applied by the sense measurement circuit to the sense node, is substantially zero.

11. An impedance measurement circuit as claimed in claim 6, wherein the control and evaluation circuit further comprises a processor unit and a digital memory unit, said digital memory unit comprising program code stored therein, which when executed on a computer causes the processor to execute a method for determining a sense impedance of a guard-sense capacitive sensor operated in loading mode that comprises the steps of:

a. applying the periodic guard voltage to the guard node using the periodic guard voltage source;
b. sequentially applying the number n of different periodic reference voltages of amplitudes $Vref_i$ via the reference impedance of predetermined value Zref, to the sense node using the reference periodic voltage source;
c. for each provided reference voltage of amplitude $Vref_i$, determining the value corresponding to the respective amplitude Imp of the current applied to the sense node by the control and evaluation circuit;
d. determining the amplitude of the sense reference voltage Vs to be provided to the sense node using the reference periodic voltage source, which would lead to the current of amplitude zero; and
e. calculating the unknown sense impedance Zx of the sense electrode, with reference to the sense reference voltage Vs determined in step d, the periodic guard voltage Vg, and the reference impedance Zref, wherein a value of the calculated unknown sense impedance indicates a nature of a body positioned adjacent the sense electrode.

\* \* \* \* \*